United States Patent [19]

Huber et al.

[11] 3,855,008

[45] Dec. 17, 1974

[54] MOS INTEGRATED CIRCUIT PROCESS

[75] Inventors: Robert J. Huber, Bountiful; James N. Fordemwalt; Kent F. Smith, both of Salt Lake City, all of Utah

[73] Assignee: General Instrument Corporation, Newark, N.J.

[22] Filed: Aug. 30, 1973

[21] Appl. No.: 392,971

[52] U.S. Cl. ........................ 148/1.5, 357/41, 357/91

[51] Int. Cl. ............................................. H01l 7/54

[58] Field of Search ................. 148/1.5 CP; 317/235

[56] References Cited

UNITED STATES PATENTS

| | | | |
|---|---|---|---|
| 3,653,978 | 4/1972 | Robinson et al. | 148/1.5 |
| 3,762,967 | 10/1973 | Holzer et al. | 148/1.5 X |
| 3,775,191 | 11/1973 | McQuhae | 148/1.5 |

*Primary Examiner*—L. Dewayne Rutledge
*Assistant Examiner*—J. M. Davis

[57] ABSTRACT

A method of forming an enhancement mode and a depletion mode transistor on a single substrate of a first conductivity type wherein each of the transistors has a pair of second conductivity type source and drain regions which are separated by a channel region and wherein an insulating layer is present on the surface of the substrate. The improvement comprises the steps of introducing a first conductivity type impurity in the substrate at the surface thereof, except in the channel region of the depletion mode transistor, reducing the amount of introduced impurity in the channel region of the enhancement mode transistor, producing contact holes in the insulating layer above the respective source and drain regions, and forming the respective gate, source and drain electrodes. The process eliminates field inversion without the necessity of a substrate bias and provides an automatic alignment of the channel of the enhancement mode transistor and the region of reduced concentration of the introduced impurity.

4 Claims, 24 Drawing Figures

MOS INTEGRATED CIRCUIT PROCESS

The invention relates to metal oxide semiconductor field effect transistor integrated circuits and more particularly to a method of forming an N-channel MOSFET integrated circuit having both enhancement mode and depletion mode transistors therein and with a sufficiently high field inversion voltage that no substrate bias is required.

One of the kinds of semiconductor devices in wide use is known as a metal oxide semiconductor field effect transistor (MOSFET). The basic MOSFET is composed of a substrate or wafer of a first conductivity type which has had two separately spaced regions doped with impurities of a second conductivity determining type. These doped regions are called the source and drain of the transistor. The region of the substrate which separates the source and drain regions is called the channel region. The substrate is provided with an insulating layer on the surface thereof normally composed of an oxide of silicon, preferably silicon dioxide. Holes are formed in the insulating layer above the source and drain regions respectively, and a conductive layer is deposited over the surface of the unit. By conventional photo-etching methods the conductive layer is delineated to form the source, drain and gate electrodes. The gate electrode must cover the entire channel region for the proper functioning of the transistor.

MOSFETS can be formed on P-type silicon substrates with N-type doped source and drain regions or on N-type silicon substrates with P-type doped source and drain regions. The former type are referred to as N-channel MOSFETS because the primary charge carriers are electrons whereas the latter type are referred to as P-channel MOSFETS because the primary charge carriers are holes. It is considered preferable to manufacture MOSFETS of the N-channel type because negative charge carriers have greater mobility than positive charge carriers thereby permitting the N-channel MOSFETS to function at a greater speed. Further, N-channel MOSFETS operate with control voltages which are more compatible with standard bipolar integrated circuits. However, N-channel type MOSFETS are known to have a detrimental electrical property called field inversion which, unless controlled, causes a parasitic effect between adjacent transistors in the circuit, thereby substantially degrading the performance of the circuit.

Since an integrated circuit consists of many individual transistors in close proximity and the main electrical conductors which interconnect them, regions (called the field) of the integrated circuit occur between adjacent transistors which are structurally similar to an individual transistor in that an electrical conductor spans two non-connected N-regions but is separated from them by an insulating layer. Should a voltage on this conductor cause a current to flow between the underlying N-regions, a parasitic transistor is formed which is detrimental to the integrated circuit. This effect, known as field inversion, must be eliminated in order to insure the proper functioning of the circuit. Various methods have been designed in order to eliminate this detrimental effect with varying degrees of success. One method of eliminating these parasitic transistors is to design the integrated circuit structure so that field inversion does not occur for any voltage that may be present on any component of the integrated circuit during normal operation. The minimum voltage causing the parasitic transistor action is known as the field inversion voltage. If the field inversion voltage is made substantially higher than the operating voltage of the MOSFET, this effect can be eliminated. However, this approach has proved to be difficult and costly.

Four electrical connections are made to the MOSFET in order to complete the structure — a connection to the gate electrode; a connection to each of the source and drain regions respectively; and a connection to the silicon substrate. In the normal operating condition, voltages are applied between the source and substrate connections and between the drain and substrate connection in such a way that each of the aforementioned pairs of connections forms a back-biased diode in the substrate. Hence, no appreciable electric current flows from either the source or the drain to the substrate. However, the gate connection acts in such a way that a voltage applied to it will control an electric current which flows from the source to the drain via that region of the unit (depletion region) near the surface of the substrate which underlies the thin insulating layer interposed between the gate electrode and the channel region and spans the space between the source and the drain. This current is commonly known as drain current. For any specific device the magnitude of the drain current and the gate voltages which allow it to flow are determined by the details of the structure such as the size and separation of the source and channel regions, the electrical conductivity of the substrate, the actual thickness of the gate insulator, and the amount of fixed electrical charge trapped in the gate insulator.

Two general classes of MOSFETS are generally recognized. These two classes are designated as depletion mode transistors and enhancement mode transistors. The essential feature of a depletion mode transistor is that the drain current flows when the voltage between the gate and source connections is zero. On the other hand, an enhancement mode device is one in which no drain current flows when the voltage between the gate and source is zero. For certain applications, particularly in the computer arts, it is highly desirable to form the integrated circuit with both enhancement and depletion mode devices on a single wafer. However, because of differences in the characteristics of these devices, a great deal of difficulty has been encountered in developing a process which can economically produce both types of transistors on a single crystalline silicon substrate.

For each transistor there is a particular voltage which, when applied to the gate electrode, produces a gate charge which just counterbalances the charge contained in surface states with the charge in the depletion region of the transistor. Beyond this voltage, known as the threshold voltage, drain current will begin to flow through the transistor. The most preferable situation is to have the drain current linearly dependent upon the gate voltage over the operating range of the transistor. Mathematically, the threshold voltage is proportional to minus the sum of the effective surface state charge density per unit area and the bulk charge per unit area associated with the channel depletion region divided by the capacitance of the gate electrode per unit area. It is known that the magnitude of the surface state charge present in the transistor controls the field inversion voltage. In the past, in order to overcome the field inversion problem techniques were employed, through the use of a thick field insulating layer doped to a high concentration by means of diffusion, to make the charge per unit area of the surface depletion region overwhelm the surface state charge, thereby minimizing the determental effect of the latter on field inversion. However, such techniques tended to substantially reduce circuit speed. Also, it is known to bias the substrate to produce reverse biased junctions which also serve to eliminate the parasitic effects, but this involves special circuits and connections.

The crystallographic orientation of the substrate plays a large part in the characteristics of the device. In the past, N-channel MOSFETS have used P-type substrates of [1 0 0] orientation because of the low surface state charge contained therein. This, of course, further helped to minimize field inversion. However, crystals of this type break much more readily in normal handling than crystals of other orientations and are more difficult to separate into individual dice. On the other hand, silicon substrates of [1 1 1] crystallographic orientation, though they are much more convenient to work with, have not commonly been used because of the high surface state charge therein.

It is therefore a prime object of the present invention to devise a method for manufacturing N-channel metal oxide semiconductor integrated circuit which incorporates both enhancement mode and depletion mode transistors on a single substrate.

It is a second object of the present invention to devise a method of manufacturing an N-channel metal oxide semiconductor integrated circuit wherein no substrate bias is required to eliminate the deleterious effects of field inversion.

It is a third object of the present invention to devise a method of manufacturing an N-channel metal oxide semiconductor integrated circuit wherein no allowances need be made in the integrated circuit layer around the enhancement mode devices to prevent the formation of a small parasitic depletion mode transistor connected in parallel with each enhancement mode transistor.

It is another object of the present invention to devise a method of manufacturing an N-channel metal oxide semiconductor integrated circuit wherein the field oxide may be relatively thin when compared to the circuits made by conventional methods.

It is a further object of the present invention to devise a metal oxide semiconductor integrated circuit which uses a substrate of high resistivity P-type with a [1 1 1] crystallographic orientation.

It is still another object of the present invention to devise a metal oxide semiconductor integrated circuit wherein the field is doped by a simple ion implantation process and wherein the concentration of implanted ions is reduced in selected regions, as by thermal oxidation of the silicon crystal in these selected regions.

It is a still further object of the present invention to devise a method of manufacturing a metal oxide semiconductor integrated circuit which utilizes standard production equipment and is economically comparable to standard commercial processes.

In accordance with the present invention a method for forming a MOS integrated circuit having enhancement mode and depletion mode transistors on a single substrate is disclosed. The method of the present invention permits the use of high resistivity P-type substrates of [1 1 1] crystallographic orientation, utilizing their high surface state charge characteristics. For purposes of illustration, an N-channel MOSFET will be used. A pair of spaced source and drain regions are formed for each of the enhancement mode and depletion mode transistors of the substrate. These regions are produced by means of doping N-type impurities into the substrate in the desired regions. An insulating layer is provided on the surface of the substrate. P-type impurities are introduced into the substrate at the surface thereof, except in the channel region of the depletion mode transistor. This is accomplished by means of a simple ion implantation process. An implantation mask is utilized over the channel region of the depletion mode transistor, and the ions are introduced into the substrate wherever the mask is not present. In this way the field is doped to increase the field inversion voltage. However, the field oxide may be relatively thin when compared to circuits made of conventional methods because of the doping procedure. This considerably simplifies the fabrication process.

The concentration of implanted ions is then reduced in the channel regions of the enhancement mode transistors, preferably and conveniently by thermal oxidation of the silicon crystal in these regions. After this step in the process there are three different concentrations of implanted atoms in the surface of the silicon crystal. There is a relatively high concentration of implanted atoms in the field areas. There is a relatively low concentration of implanted atoms in the channel regions of the enhancement mode devices. There are none of these implanted ions in the channel regions of the depletion mode devices. The ratio of these concentrations can be controlled to give the desired electrical parameters. Therefore, three different optimum concentrations in different areas of the substrate are achieved with a single ion implantation step.

Further, the doped field regions and the perimeter of the enchancement mode transistor channel are self-aligning. That is, no area allowances need be made in the integrated circuit layout around the enhancement mode devices for the variations which normally occur in the fabrication process. Such allowances, if made, would result in a small parasitic depletion mode transistor being connected in parallel with each enhancement mode transistor and therefore would tend to degrade the electrical characteristics of the device. The method of the present invention insures that the boundary between the field oxide and the gate oxide for the enhancement mode transistor coincides exactly with the boundary between the high concentration of implanted ions in the field and the relatively low concentration of implanted ions in the channel region.

Next, the oxide layer is selectively removed by photoengraving methods over a portion of each of the source and drain regions to provide contact holes. A suitable layer of conductive material is then coated on the unit and etched to produce the source, drain and gate electrodes respectively.

In this way, high resistivity P-type substrates of [1 1 1] crystallographic orientation can be utilized, despite their high surface state charges, in a process which dopes the field by a simple ion implantation process which neutralizes the high surface state charges of the field. The ion implant methods are used to make enhancement mode MOS transistors and the field oxide may be relatively thin when compared to circuits made by conventional methods, thus simplifying the fabrication process. The depletion mode MOS transistors are made by processing for a relatively high surface state charge which also simplifies the manufacturing process. The end result of the method of the present invention is an MOS integrated circuit having both enhancement mode and depletion mode transistors and demonstrating a sufficiently high field inversion voltage so that no substrate bias is required during operation. Further, the process utilizes only standard apparatus, and is as efficient and economical as comparable process, while accomplishing excellent results. processes, To the accomplishment of the above, and to such other objects as may hereinafter appear, the present invention relates to a method for manufacturing an MOS integrated circuit having both enhancement mode and depletion mode transistors therein as defined in the appended claims and as described in the specification, taken together with the accompanying drawings in which:

Figure 1:
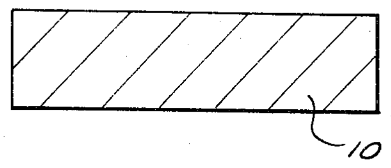
FIGS. 1 and 2 are schematic cross-sectional and top plan views respectively showing the substrate in its original condition ready for processing.

The invention will be here specifically disclosed in conjunction with the formation of a single pair of transistors, one of which (to the left as shown in the drawings) is an enhancement mode transistor and the other of which (to the right as shown in the drawings) is a depletion mode transistor. However, it will be obvious that the techniques disclosed herein in conjunction with the single pair of transistors can be utilized simultaneously for all of the MOSFETS in the integrated circuit, if desired.

Figure 2:
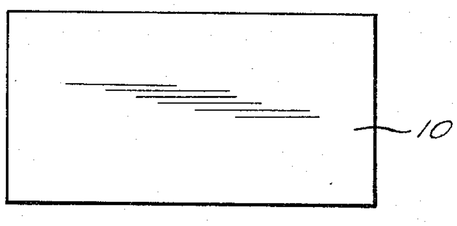

As shown in FIGS. 1 and 2, the transistors are formed of a substance or wafer 10, preferably of monocrystalline silicon of [1 1 1] orientation and of P-conductivity type. The wafer 10 is prepared by conventional slicing, polishing and cleaning techniques. Usually the wafer is lapped, cleaned, degreased and chemically etched to remove the lapping damage on the surface in preparation for the succeeding steps.

A thin insulating layer 12, preferably of silicon dioxide, is then formed on the substrate. Such a layer may be formed, for example, by thermally oxidizing the wafer at between 850°–1300°C in a furnace in the presence of dry oxygen or water vapor as the suitable oxidizing agent. Generally, this layer is formed from about 100 to several thousand Angstroms thick. Layer 12 will ultimately be used as a diffusion mask during the doping operation.

Figure 3:
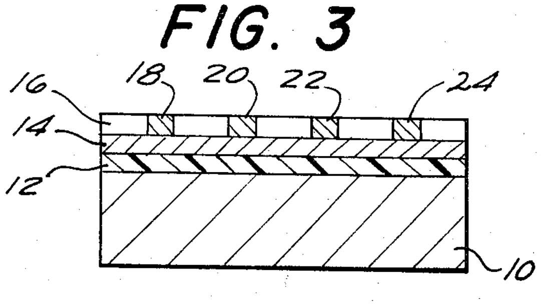
FIGS. 3 and 4 are views similar to FIGS. 1 and 2 respectively but showing an insulating layer, a photoresist layer, and a mask situated on the substrate.
Figure 4:
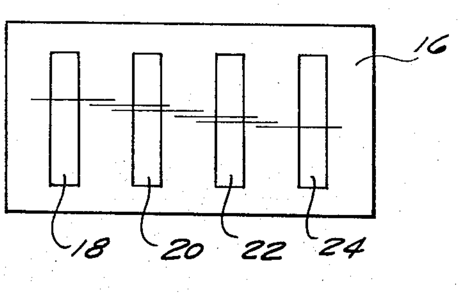

A layer 14 of photoresist is then formed on the insulating layer 12. For example KPR may be used, KPR being a tradename for a product of the Eastman Kodak Company. Layer 14 is dried and heated to form a hard emulsion. An accurately formed high resolution glass emulsion mask 16 is then placed in intimate contact with the top surface of layer 14 as shown in FIGS. 3 and 4. Mask 16 has four opaque portions 18, 20, 22 and 24 therein. Portions 18 and 20 correspond to the desired position of the source and drain regions respectively of the enhancement mode transistor. Portions 22 and 24 respectively correspond to the desired position of the source and drain regions of the depletion mode transistor.

The unit is exposed to a collimated beam of ultraviolet light which polymerizes the exposed portions of the photoresist layer 14. The mask is taken off and the unpolymerized portions of the photoresist layer are removed by an appropriate solvent such as xylene. The polymerized portions remain as an adherent etch-resistant pattern.

Figure 5:
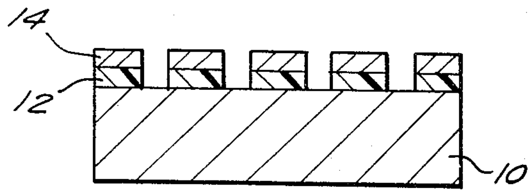
FIGS. 5 and 6 are views similar to FIGS. 3 and 4 respectively but showing the mask removed, the unexposed portions of the photoresist layer washed away and the insulating layer after it has been etched.
Figure 6:
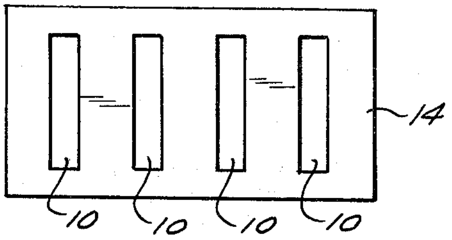
Figure 7:
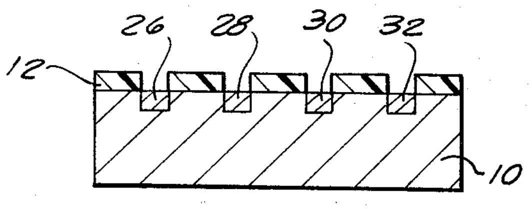
FIGS. 7 and 8 are similar views to FIGS. 5 and 6 respectively, but showing the substrate after the remainder of the photoresist layer has been removed and the substrate has been doped to form a source and drain pair for each transistor.
Figure 8:
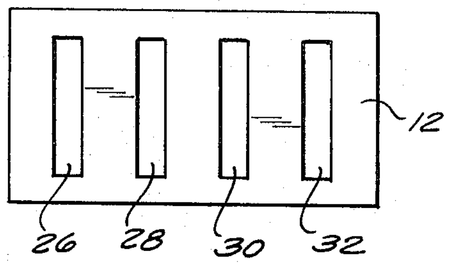

A solution of hydrofluoric acid is utilized to etch away the exposed portions of the silicon dioxide layer 12 down to substrate 10. This is shown in FIGS. 5 and 6. The polymerized photoresist layer 14 is then removed by sulfuric acid. With the remaining portions of layer 12 as a mask, the unit is doped by conventional methods such as by using a phosphorous-containing substance as a source metered in a carrier gas, which may contain oxygen to reduce pitting. Doping normally takes about 60 minutes at a temperature of 1150°C. Source and drain regions 26 and 28 respectively of the enhancement mode transistor, and source and drain regions 30 and 32 respectively of the depletion mode transistor are thus formed (FIGS. 7 and 8).

A second insulating layer 12' is then formed over the surface of the unit. This layer is preferably composed of silicon dioxide which may be formed by the thermal oxidation of silicon, as described above, by a chemical vapor depositon process, or a combination of the two. Preferably, in this example, the combined thickness of first insulating layer 12 and second insulating layer 12' is approximately 4,700 Angstroms. Prior art processes normally required field insulation to be form 3 to 4 times this thickness to control field inversion. Other insulating materials could be conceivably used at this point. Examples of such materials would be silicon nitride or aluminum oxide.

Figure 9:
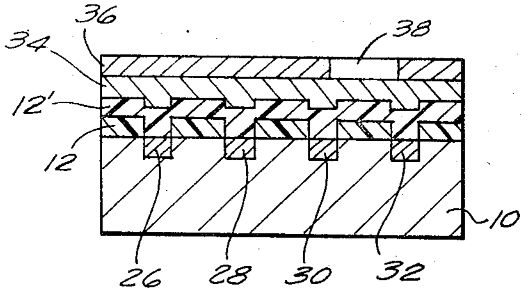
FIGS. 9 and 10 are views similar to FIGS. 7 and 8 respectively but showing the substrate after an additional insulating layer has been formed, a second photoresist layer deposited thereon and a second mask overlying the photoresist layer.
Figure 10:
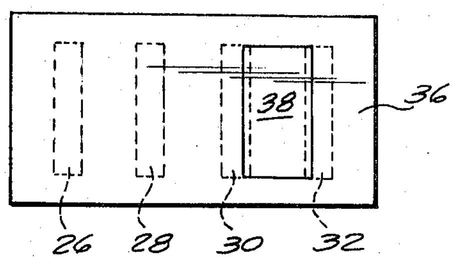
Figure 11:
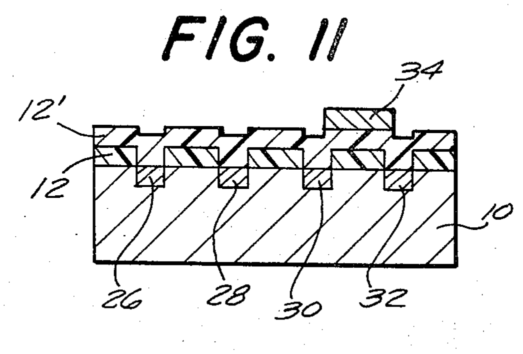
FIGS. 11 and 12 are views similar to those shown in FIGS. 9 and 10 respectively but showing the second mask removed and the unexposed portions of the photoresist layer washed away.
Figure 12:
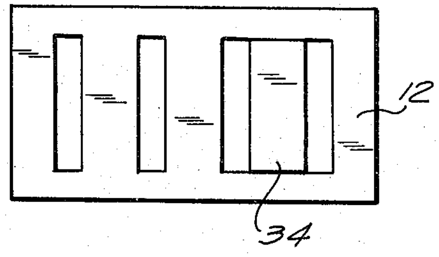

A second photoresist layer 34 is then coated on the surface of layer 12'. A second accurately formed high resolution glass emulsion mask 36 is then placed in intimate contact with the top surface of photoresist layer 34. Mask 36 has a transparent portion 38 which corresponds in position to the channel region of the depletion mode transistor. (FIGS. 9 and 10).

The unit is again exposed to a collimated beam of ultraviolet light which polymerizes the exposed portions of the photoresist layer 34. The mask is taken off and the unploymerized portion of layer 34 is removed by the appropriate solvent. Remaining on the oxide layer 12' is a portion of photoresist layer 34 which corresponds in position to the channel region of the depletion mode transistor and will act as an ion implantation mask. The ion implantation mask may be composed of any convenient material of sufficient thickness to prevent high speed ions which will bombard the surface from penetrating to the top surface of the silicon substrate in this area. The most common material for this mask is photoresist. However, other materials would work in this regard although they would be much less convenient to use. Such materials would be a metal layer that has been evaporated and then photoengraved in the proper pattern, a layer of silicon dioxide either deposited or grown thermally which has been photoengraved into the proper pattern, or a shadow mask if the geometry allows it. A shadow mask is a separate thin piece of material which has holes cut into it corresponding to the areas to be implanted. It is then placed above the substrate to be implanted and simply acts to mask selected portions of the unit from the high speed ions.

The unit is exposed to a stream of high speed ions of any appropriate element which will produce P-type regions in the substrate. For example, boron ions have proved effective for this purpose. The speed of the ions is controlled so that they penetrate into substrate 10 in all areas along the surface with the exception of the channel region of the depletion mode transistor which has an ion implantation mask 34 on the surface thereof. The penetration and concentration of the implanted ions can be accurately controlled through the energy thereof and the exposure time.

Figure 13:
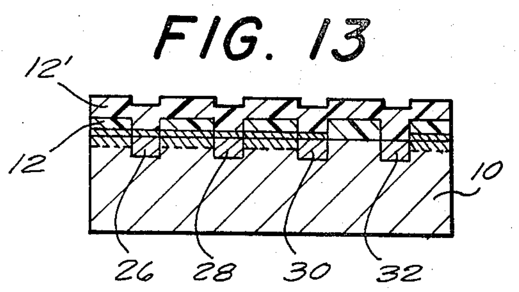
FIGS. 13 and 14 are views similar to FIGS. 11 and 12 respectively but showing the unit after the completion of the ion implantation process and the removal of the remainder of the photoresist layer.
Figure 14:
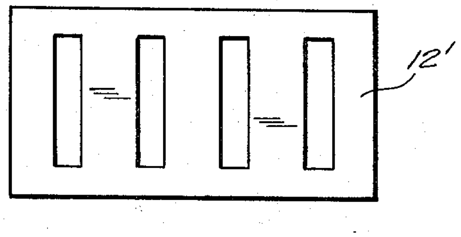

After the termination of the ion implantation step, the portions directly below the surface of wafer 10 in all regions, with the exception of the channel region of the depletion mode transistor, contain relatively high concentrations of implanted atoms. The ion implantation mask is removed and the unit appears as shown in FIGS. 13 and 14.

It should be noted that the region containing the implanted atoms extends a significant distance in either direction from the silicon-silicon dioxide interface. It is well known that for a given energy the ranges of high energy ions through matter have a statistical distribution about some average level. In the case being described here, the distribution of ranges is approximately Gaussian in shape. The thickness of the insulating layer 12, 12' described herein preferably is chosen so that the center of the Gaussian distribution lies at the interface or just slightly inside the silicon dioxide. A specific numerical example which has been used in reducing this invention to practice uses boron ions accelerated to an energy of 150,000 electron volts. the average penetration of these 150,000 ev boron ions through silicon dioxide is approximately 4,400 Angstroms. The standard deviation of the resulting Gaussian distribution is approximately 730 Angstrom units. The thickness of the insulating layers 12 and 12' through which these ions are implanted was chosen to be 4,700 Angstroms plus or minus 100 Angstroms. For silicon dioxide layers of this thickness, a standard ion implantation machine can be used to obtain the desired results. Prior art normally utilizes a field oxide layer of approximately 15,000 Angstroms thick. The process of the present invention will work with a layer of this thickness but a special accelerator is necessary in conjunction with the implantation machine in order to achieve the desired penetration. With the values which were used here, the peak of the Gaussian distribution of the implanted atoms lies on the silicon dioxide side of the silicon dioxide interface, so that the tail of the distribution extends substantially into the silicon substrate. The ions which remain in the silicon dioxide layer do not in any way adversely effect the electrical properties of the MOSFET and may slightly enhance the functioning of the device. Of course, if ions of different energy are implanted, the thickness of the insulating layer must be varied appropriately.

Figure 15:
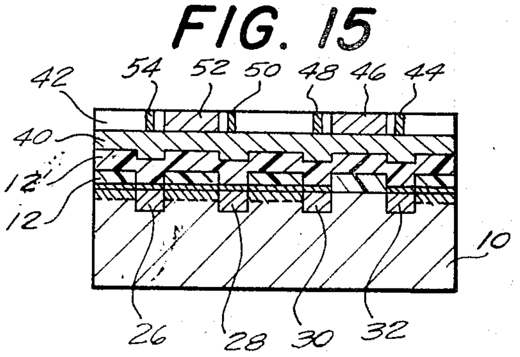
FIGS. 15 and 16 are views similar to that shown in FIGS. 13 and 14 respectively but showing the unit after a third photoresist layer and third mask are situated thereon.
Figure 16:
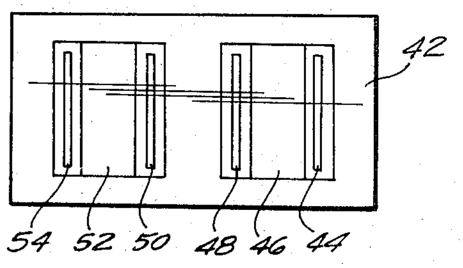

The next step in the process, as illustrated in FIGS. 15 and 16, is to form a third photoresist layer 40 on the surface of the unit upon which a third mask 42 is placed. Mask 42 has opaque portions 54 and 50 which correspond to the source and drain regions respectively of the enhancement mode transistor, and opaque 48 and 44 which correspond to the source and drain regions of the depletion mode transistor. Further, opaque portions 52 and 46 are provided corresponding in position to the channel regions of the enhancement mode and depletion mode transistors respectively.

Figure 17:
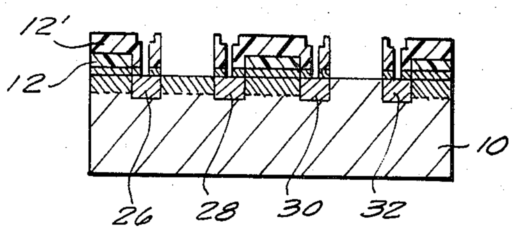
FIGS. 17 and 18 are views similar to that shown in FIGS. 15 and 16 respectively but showing the unit after the third mask has been removed, the unexposed portions of the third photoresist layer washed away, the exposed portions of the oxide layers detached, and the remaining portions of the third photoresist layer removed.
Figure 18:
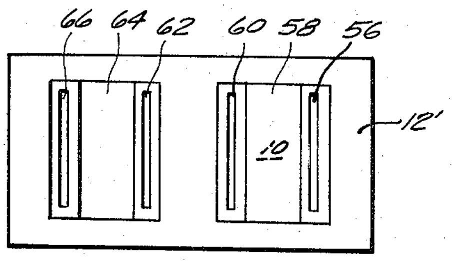
Figure 19:
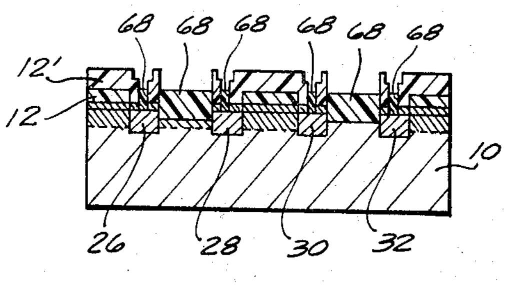
FIGS. 19 and 20 are views similar to that shown in FIGS. 17 and 18 respectively but showing the unit after insulating layers have been grown in the channel regions of the transistors.
Figure 20:
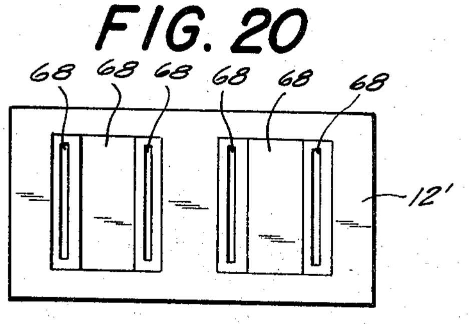

The unit is then exposed to a collimated beam of ultraviolet light and the mask removed. The unpolymerized portions of photoresist layer 40 are removed and a suitable etchant is utilized to remove the portions of insulating layers 12 and 12' down to the surface of substrate 10. The remaining portions of photoresist layer 40 are then removed with the result appearing as shown in FIGS. 17 and 18.

Next, a relatively thin layer of silicon dioxide is grown over the regions of silicon exposed in the previous step. This is done by placing the unit in a diffusion furnace into which oxygen or wet gas is introduced as an oxidant to thermally grow the exposed portions of the silicon into silicon dioxide layer 68. The growth of the silicon dioxide layer takes place mainly in the channel regions of the enhancement mode and depletion mode transistors respectively (although some growth also takes place in the openings which are to become contact holes). The silicon in the channel of the enhancement mode transistor contains some of the ion implanted atoms. Since some of this silicon crystal is consumed during the oxidation process, the number of implanted atoms in the surface of the crystal is reduced in the channel region of the enhancement mode transistor. Of course, there are no implanted ions in the channel region of the depletion mode transistor; therefore, this growth step does not effect the electrical properties of the depletion mode transistor.

For example, it has been observed that in order to grow a silicon dioxide layer 1000 Angstroms thick, 550 Angstroms of silicon are consumed. Any of the implanted ions which lie in the portion of the silicon substrate which are consumed are incorporated into the silicon dioxide and therefore become electrically inactive and do not affect the electrical characteristics of the device. Thus, if the ion concentration in the silicon is between $1 \times 10^{12}$ and $1 \times 10^{14}$ ions per square centimeter before growth takes place, the concentration is less than half this value after growth.

Further, since the unit is heated to cause the growth, this step also acts as an annealing step. Such is necessary to activate the implanted atoms to demonstrate the desired properties within the substrate.

After this step in the process there are three different concentrations of implanted atoms in the surface of the silicon crystal. In the (non-reoxidized) field areas, there is a relatively high concentration of implanted atoms. In the (oxidized) channel region of the enhancement mode device, there is a relatively low concentration of implanted atoms due to the oxidation which has taken place in this area. In the channel region of the depletion mode device, there are no implanted atoms. The ratio of these concentrations can be controlled to give the desired electrical parameters. Thus, three different concentrations are achieved with a single ion implantation step.

Further, the boundary between the field oxide 12 and 12' and the gate oxide 68 for the enhancement mode transistors coincides exactly with the boundary between the high concentration of implanted ions in the field and the relatively low concentration of implanted atoms in the channel region. This self-alignment feature is of major significance when designing circuits because, as mentioned before, no area allowances need be made in the integrated circuit layer around the enhancement mode devices for the variations which normally occur in the fabrication process. These allowances, which normally must be made, result in a small parasitic depletion mode transistor being connected in parallel with each enhancement mode transistor and thus the electrical characteristics of the enhancement mode transistors are somewhat degraded.

Figure 21:
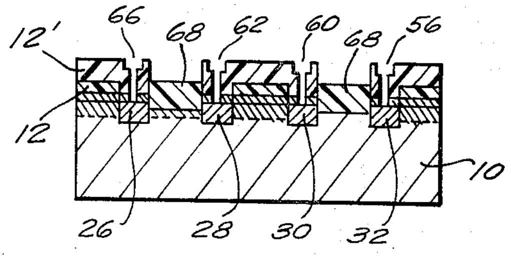
FIGS. 21 and 22 are views similar to those shown in FIGS. 19 and 20 respectively but showing the unit after the appropriate contact holes have been opened to the source and drain regions, respectively deposited of each transistor.
Figure 22:
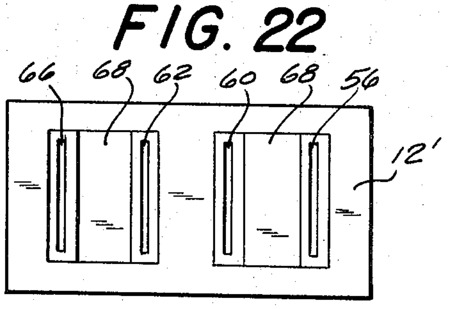

The next step in the process is to eliminate the insulating layer 68 which has inadvertently been grown in the contact holes. This is done by a photoengraving process (not illustrated) substantially as described above. Once the contact holes have been cleared the unit looks substantially as shown in FIGS. 21 and 22.

Figure 23:
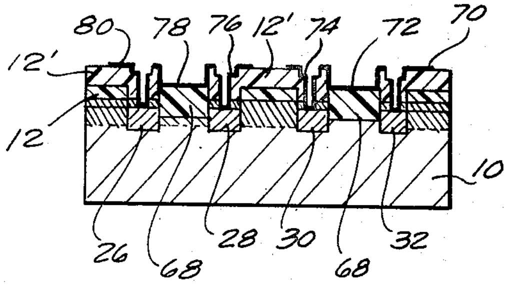
FIGS. 23 and 24 are views similar to those shown in FIGS. 21 and 22 respectively but showing the source, drain and gate electrodes, respectively deposited one each of the transistors.
Figure 24:
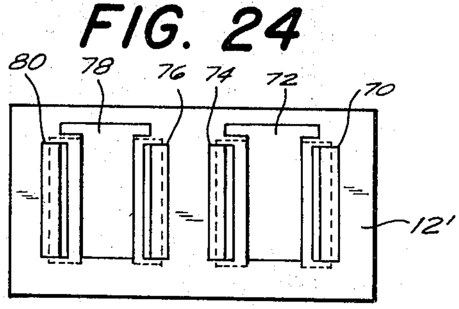

Next, the respective source, drain and gate electrodes are formed by depositing a layer of conductive material such as aluminum over the surface of the unit. By photoengraving techniques, (not shown) again as substantially described above, the aluminum layer is delineated into the respective electrodes. As ahown in FIGS. 23 and 24, electrodes 80 and 76 are the source and drain electrodes respectively for the enhancement mode transistor and electrodes 74 and 70 are the source and drain electrodes respectively for the depletion mode transistor. Electrodes 78 and 72 are the gate electrodes for the enhancement mode and depletion mode transistors respectively.

For transistors produced by the process of the present invention it has been found that enhancement mode transistor threshold voltages may be controlled to cover a range of a small fraction of 1 volt to several volts positive. Depletion mode transistor thresholds generally may be controlled to cover a range of approximately one volt to 5 or more volts negative. Field inversion voltage is in the range from 10 to 30 volts depending upon the thickness of the oxide layer and ion implant level. Since the field inversion voltage is significantly higher than the threshold voltage, the field inversion problem is successfully overcome. The ion implant level will be in the range of $1 \times 10^{12}$ implanted ions per square centimeter to $1 \times 10^{14}$ implanted ions per square centimeter.

There are a number of elements which might provide the implanted ions, although for purposes of illustration in this specification boron was chosen. However, if one is making N-channel transistors or integrated circuits by this process the implanted ions will normally come from group III of the periodic table.

Because the field inversion voltage inherent in transistors formed by the process of the present invention is so much higher than the threshold voltage of the transistors, no substrate bias is required in order to eliminate the deleterious effects of field inversion. The present process, therefore, is a process for making MOS integrated circuits which use standard equipment and is economically comparable to present processes. However, it permits the formation of both enhancement mode and depletion mode transistors on a single wafer while eliminating the detrimental effects of field inversion without substrate biasing and provides for self-alignment of the channel region of the enhancement mode transistor.

A single preferred embodiment of the present invention has been specifically disclosed herein for purposes of illustration. It is apparent that many variations and modifications may be made upon the specific method disclosed herein. It is intended to cover all of these variations and modifications which fall within the scope of this invention as defined by the appended claims.

We claim:

1. In a method of simultaneously forming a pair of transistors, one of which is operative in a first mode and the second of which is operative in a second mode, on a single substrate of a first conductivity type wherein each of the transistors has a pair of second conductivity type source and drain regions separated by a channel region at a surface of said substrate and where an insulating layer is present on said surface of the substrate, the improvement comprising the steps of introducing a first conductivity type impurity in the substrate at the surface except in certain regions therein, reducing the amount of impurity in selected portions of the impurity containing regions to form a first set of regions having no impurity therein, a second set of regions having a reduced concentration of impurity therein and a third set of regions having a nonreduced concentration of impurity therein, producing contact holes in the insulating layer of the respective source and drain regions, and forming the respective gate, source and drain electrodes.

2. The method according to claim 1 wherein said first mode is an enhancement mode and said second mode is a depletion mode and wherein said first set of regions is the channel region of the depletion mode transistor and wherein said second set of regions is the channel region of the enhancement mode transistor and wherein said third set of regions includes the substrate between said transistors.

3. The method according to claim 2 wherein the impurity introducing step comprises covering the channel region of the depletion mode transistor with an ion implantation mask and exposing the surface of the unit to a beam of first conductivity determining type ions.

4. The method of claim 1 wherein the impurity amount reducing step comprises growing an oxide layer over said second set of regions.

* * * * *